(12) United States Patent
Sakai et al.

(10) Patent No.: US 12,113,330 B2
(45) Date of Patent: Oct. 8, 2024

(54) SEMICONDUCTOR LASER DEVICE

(71) Applicant: ROHM CO., LTD., Kyoto (JP)

(72) Inventors: Kenji Sakai, Kyoto (JP); Kazuyoshi Izumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 784 days.

(21) Appl. No.: 17/276,802

(22) PCT Filed: Sep. 19, 2019

(86) PCT No.: PCT/JP2019/036698
§ 371 (c)(1),
(2) Date: Mar. 16, 2021

(87) PCT Pub. No.: WO2020/066821
PCT Pub. Date: Apr. 2, 2020

(65) Prior Publication Data
US 2021/0265812 A1 Aug. 26, 2021

(30) Foreign Application Priority Data
Sep. 26, 2018 (JP) ................................. 2018-180089

(51) Int. Cl.
*H01S 5/023* (2021.01)
*H01S 5/022* (2021.01)
(Continued)

(52) U.S. Cl.
CPC .......... *H01S 5/02345* (2021.01); *H01S 5/022* (2013.01); *H01S 5/023* (2021.01); *H01S 5/02212* (2013.01)

(58) Field of Classification Search
CPC .... H01S 5/0231; H01S 5/023; H01S 5/02345; H01S 5/02315; H01S 5/02355; H01S 5/022; H01S 5/02212
See application file for complete search history.

(56) References Cited

U.S. PATENT DOCUMENTS

2005/0047460 A1* 3/2005 Go ...................... H01S 5/02212
372/36
2005/0105572 A1* 5/2005 Simoun-Ou ........ H01S 5/02212
372/38.1
(Continued)

FOREIGN PATENT DOCUMENTS

JP     10-256643 A    9/1998
JP     2010-183002 A  8/2010
(Continued)

OTHER PUBLICATIONS

International Search Report issued in PCT/JP2019/036698, Dec. 10, 2019 (2 pages).

*Primary Examiner* — Tod T Van Roy
*Assistant Examiner* — Delma R Forde
(74) *Attorney, Agent, or Firm* — HSML P.C.

(57) ABSTRACT

A semiconductor laser device includes a semiconductor laser chip that emits laser light, a plate-like base, and a block protruding from the base and supporting the semiconductor laser chip. The block has a supporting surface and a wire bonding surface. The supporting surface faces a first side in a first direction perpendicular to the laser light emitting direction, and supports the semiconductor laser chip. The wire bonding surface is a surface to which a wire connected to the semiconductor laser chip is connected. The wire bonding surface is shifted in a second direction perpendicular to the emitting direction and the first direction with respect to the supporting surface. The wire bonding surface is inclined relative to the supporting surface, such that the wire bonding surface is more offset to a second side in the first direction with increasing distance from the supporting surface in the second direction.

12 Claims, 9 Drawing Sheets

(51) Int. Cl.
*H01S 5/02345* (2021.01)
*H01S 5/02212* (2021.01)

(56) References Cited

U.S. PATENT DOCUMENTS

| | | | |
|---|---|---|---|
| 2006/0114950 A1* | 6/2006 | Yen | ..................... H01S 5/02212 |
| | | | 372/38.07 |
| 2010/0008093 A1 | 1/2010 | Lin et al. | |
| 2010/0074288 A1* | 3/2010 | Yamamoto | ............ H01S 5/0231 |
| | | | 372/43.01 |

FOREIGN PATENT DOCUMENTS

| | | | | |
|---|---|---|---|---|
| JP | 2011-66327 A | | 3/2011 | |
| JP | 2013-258434 A | | 12/2013 | |
| JP | 2014-22379 A | | 2/2014 | |
| JP | 2014-49523 A | | 3/2014 | |
| KR | 100787280 | * | 12/2007 | ......... H01S 5/02469 |
| WO | WO2021059805 | * | 4/2021 | ............. H01S 5/022 |

* cited by examiner

SEMICONDUCTOR LASER DEVICE

TECHNICAL FIELD

The present disclosure relates to a semiconductor laser device.

BACKGROUND ART

Conventionally, a semiconductor laser device is used as a light source in various electronic devices. For example, JP-A-2010-183002 discloses an example of such a semiconductor laser device. The semiconductor laser device disclosed in Patent Document 1 includes conductive stem, a semiconductor laser chip, a sub-mount, a plurality of leads, and a cap. The stem has a base having a disc shape, and block having a rectangular parallelepiped shape protruding from the base in an emitting direction of light. The semiconductor laser chip is mounted on a supporting surface (i.e., a surface parallel to the emitting direction) of the block via the sub-mount. The plurality of leads are fixed to the stem, and extend in parallel to each other. The semiconductor laser chip is electrically connected to a surface (i.e., wire bonding surface) of the sub-mount via a first wire. The sub-mount is electrically connected to one of the plurality of leads via a second wire. The cap covers the block and the semiconductor laser chip.

In the conventional semiconductor laser device described above, the wire bonding surface of the sub-mount is parallel to the supporting surface of the block. In other words, the wire bonding surface faces in a direction perpendicular to the emitting direction. Bonding of the first and second wires is performed by, for example, pressing the wires (and applying ultrasonic vibrations) against the respective bonding spots with a capillary while holding the periphery of the base.

In this conventional semiconductor laser device, the base of the stem has a circular shape. Accordingly, the base may be displaced in the peripheral direction from the initial setting position during the wire bonding operation. Such a displacement may cause the bonding area between a wire and the wire bonding surface to be unduly small, leading to insufficient bonding strength of the wire with respect to the wire bonding surface.

PRIOR ART DOCUMENT

Patent Document

Patent Document 1: JP-A-2010-183002

SUMMARY OF THE INVENTION

Technical Problem to be Solved by the Invention

In view of the above circumstances, the present disclosure aims to provide, for example, a semiconductor laser device suitable for preventing the wire bonding strength from decreasing.

Solution to Problem

A semiconductor laser device provided by the present disclosure includes: a semiconductor laser chip that emits laser light in an emitting direction; a base having a plate-like shape; and a block protruding from the base in the emitting direction and supporting the semiconductor laser chip. The block has a supporting surface and a first wire bonding surface. The supporting surface faces a first side in a first direction perpendicular to the emitting direction, and supports the semiconductor laser chip. The first wire bonding surface is a surface to which a first wire connected to the semiconductor laser chip is connected. The first wire bonding surface is shifted in a second direction, which is perpendicular to the emitting direction and the first direction, with respect to the supporting surface. The first wire bonding surface is inclined relative to the supporting surface, such that the first wire bonding surface is more offset to a second side in the first direction with increasing distance from the supporting surface in the second direction.

Other features and advantages of the present disclosure will become apparent from the detailed description given below with reference to the accompanying drawings.

MODE FOR CARRYING OUT THE INVENTION

Figure 1:
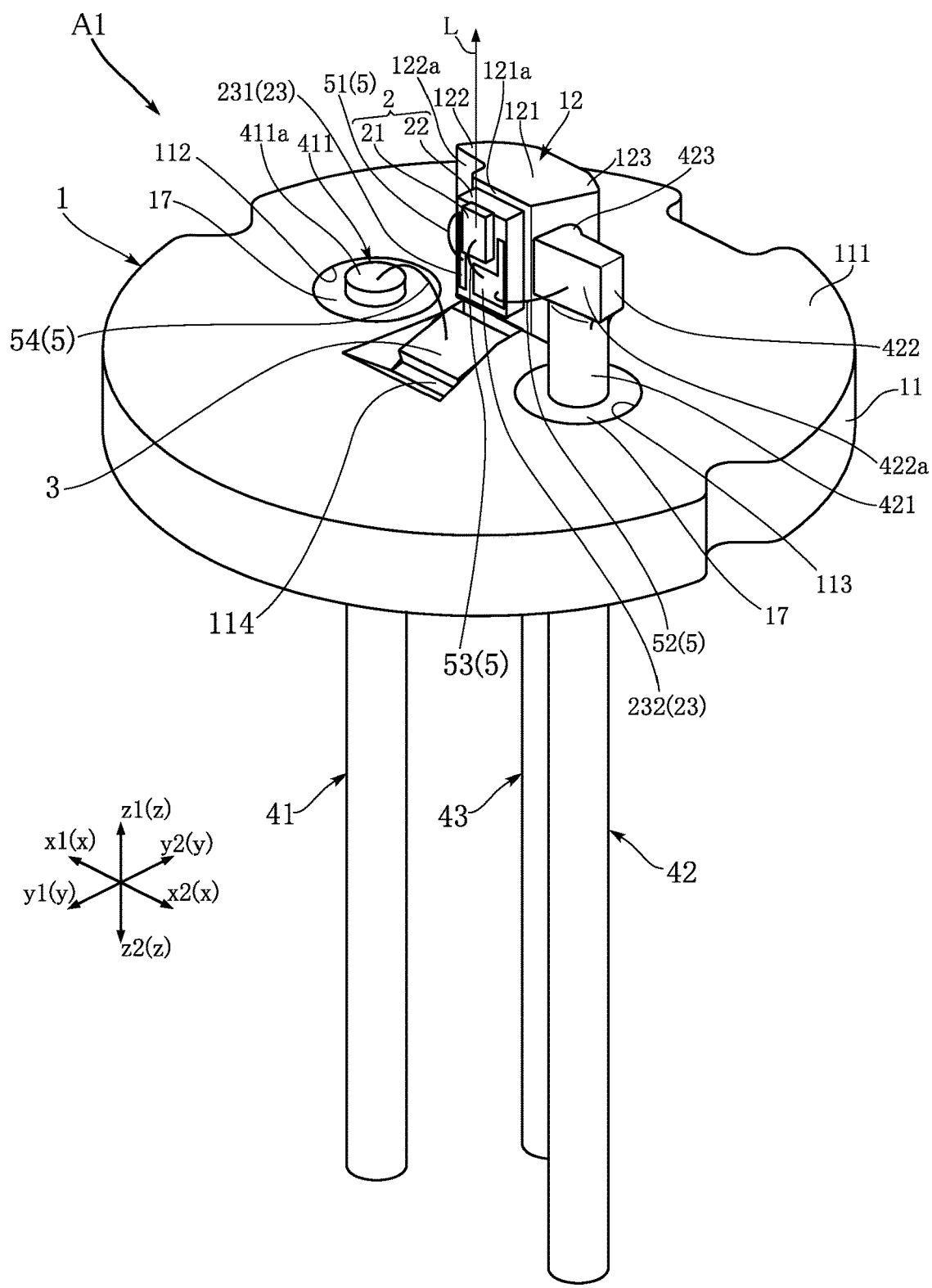
FIG. 1 is a perspective view showing a semiconductor laser device according to a first embodiment.

FIGS. 1 to 6 show a semiconductor laser device according to a first embodiment. As shown in FIG. 1, a semiconductor laser device A1 of the present embodiment includes a stem 1, a semiconductor laser chip 2, a light receiving element 3, a plurality of leads 41, 42 and 43, and a plurality of wires 5. The semiconductor laser device A1 can be used as, but not limited to, a light source device provided for various electronic devices. To facilitate understanding, FIGS. 3 and 4 do not show the wires 5.

In the present disclosure, three mutually perpendicular directions (x, y and z) are referred to, where appropriate in the description of the embodiments. As shown in FIG. 1, the direction z corresponds to the emitting direction of the semiconductor laser chip 2. The direction z includes two mutually opposite directions (z1 and z2), which are referred to as "direction z1" and "direction z2" in the following description. As shown in FIG. 1, the direction z1 is a direction forward in the emitting direction of the semiconductor laser chip 2, and the direction z2 is a direction backward in the emitting direction of the semiconductor laser chip 2. Similarly, the direction x includes "direction x1" and "direction x2" which are opposite to each other, and the direction y includes "direction y1" and "direction y2" which are opposite to each other.

Figure 2:
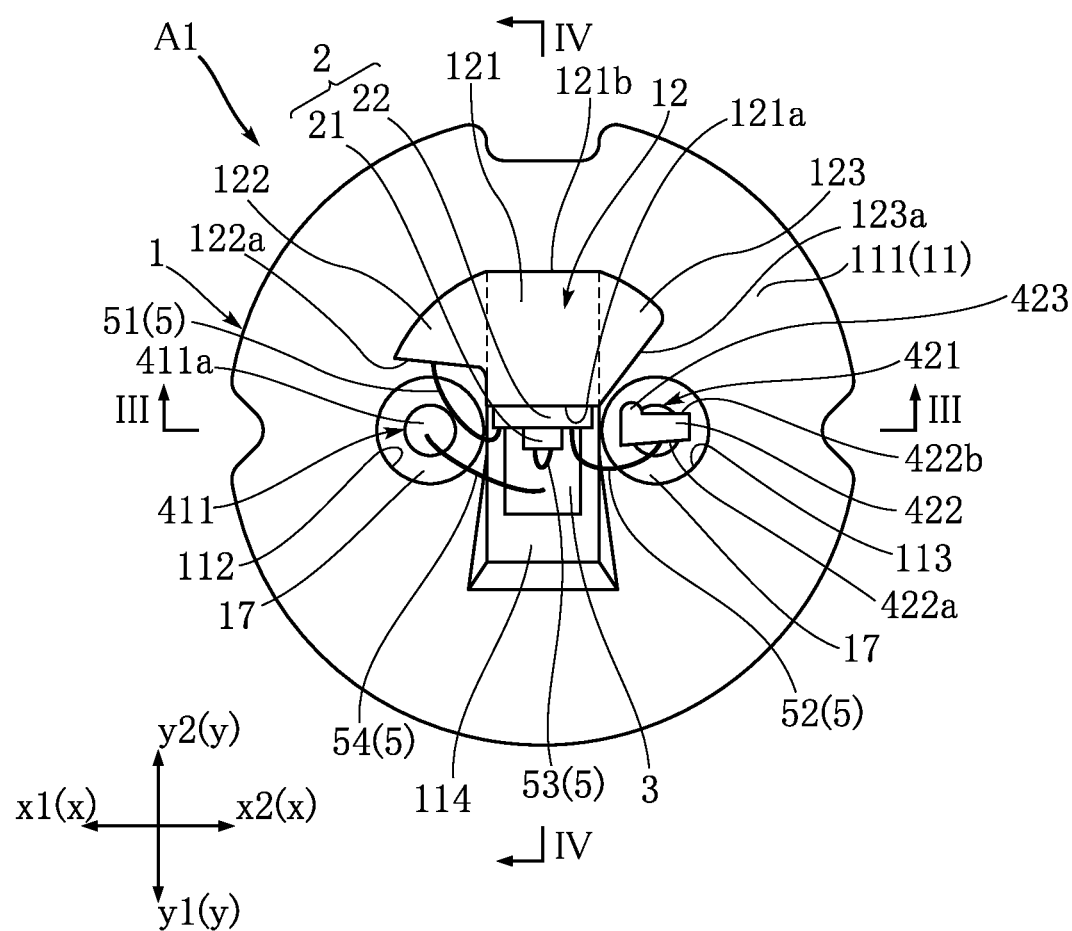
FIG. 2 is a plan view showing the semiconductor laser device of FIG. 1.
Figure 3:
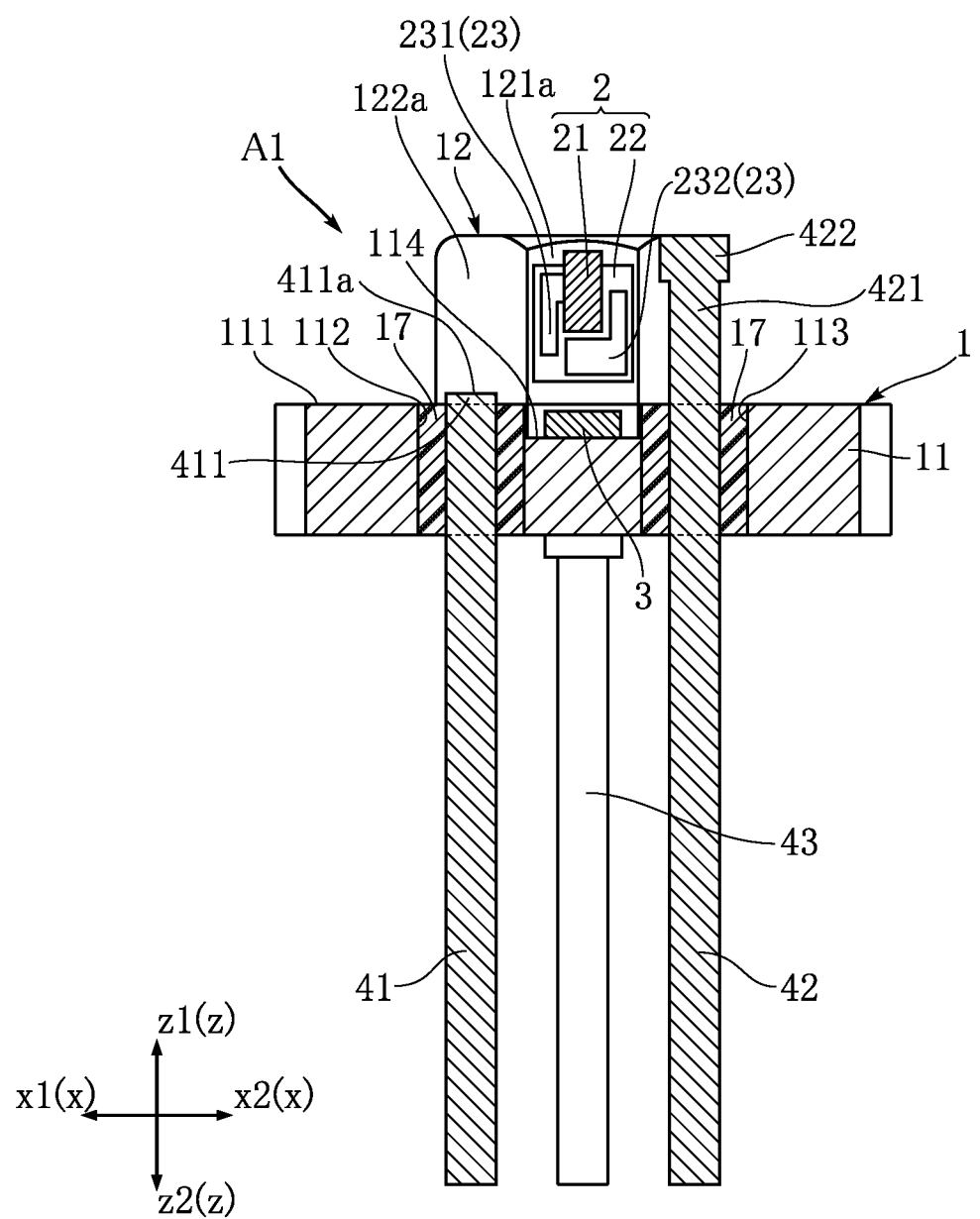
FIG. 3 is a cross-sectional view along line III-III of FIG. 2.
Figure 4:
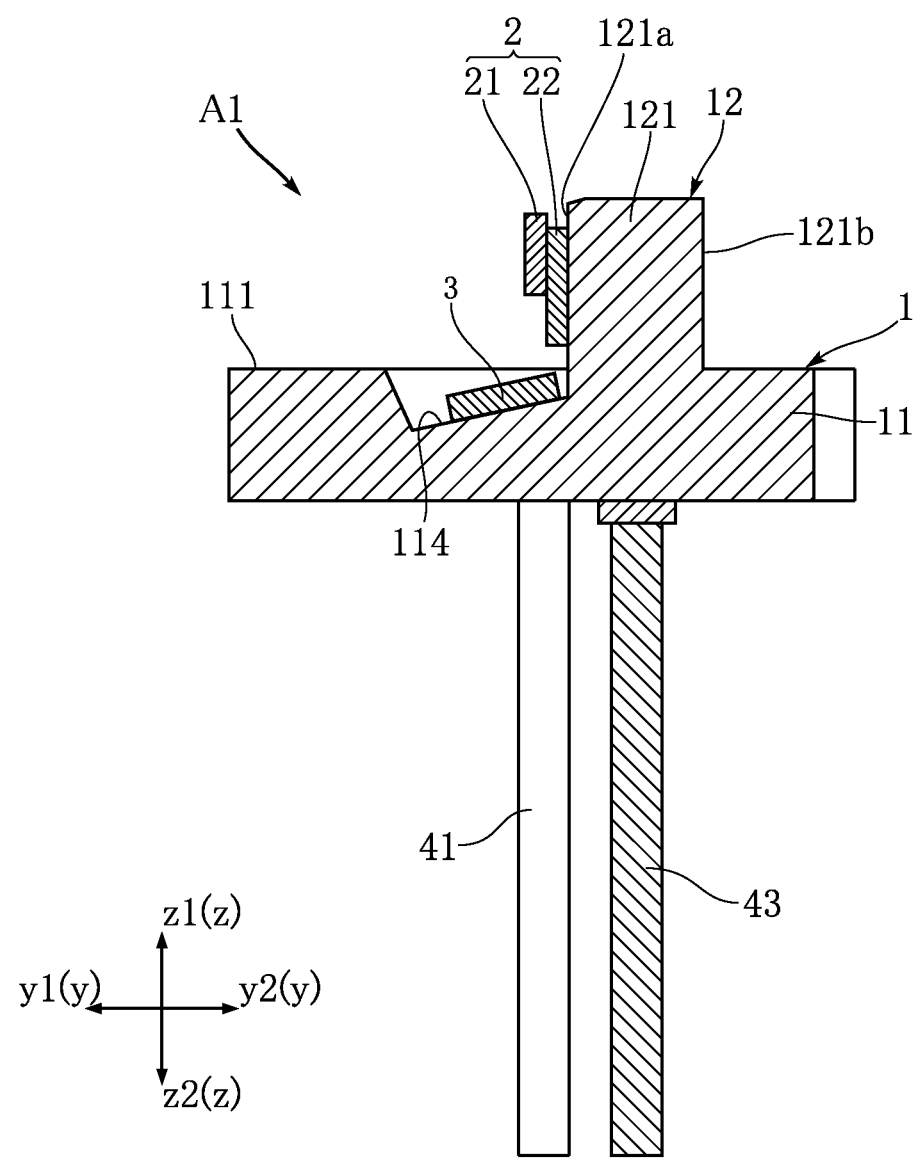
FIG. 4 is a cross-sectional view along line IV-IV of FIG. 2.
Figure 5:
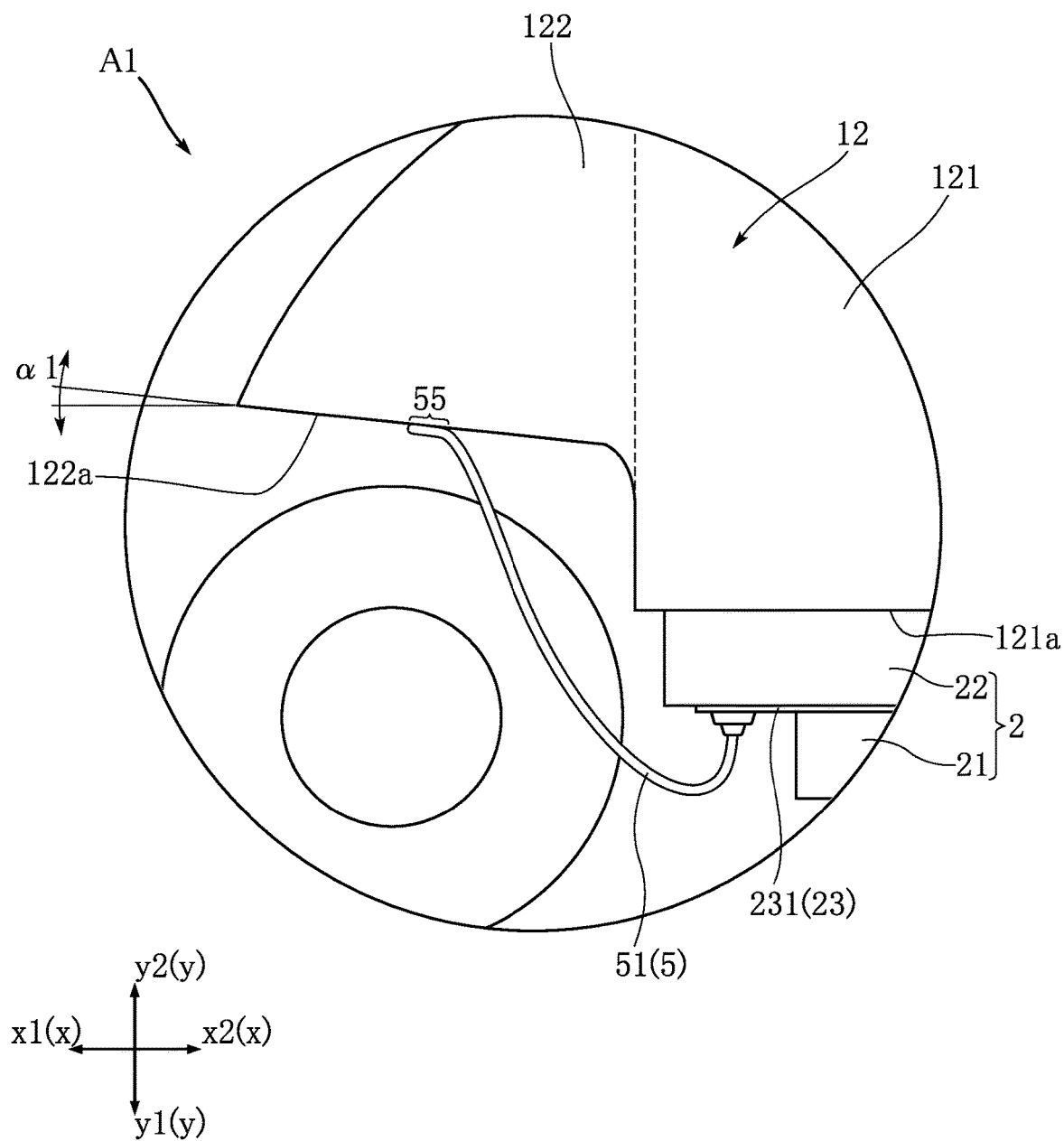
FIG. 5 is a plan view showing a part of the semiconductor laser device of FIG. 1.
Figure 6:
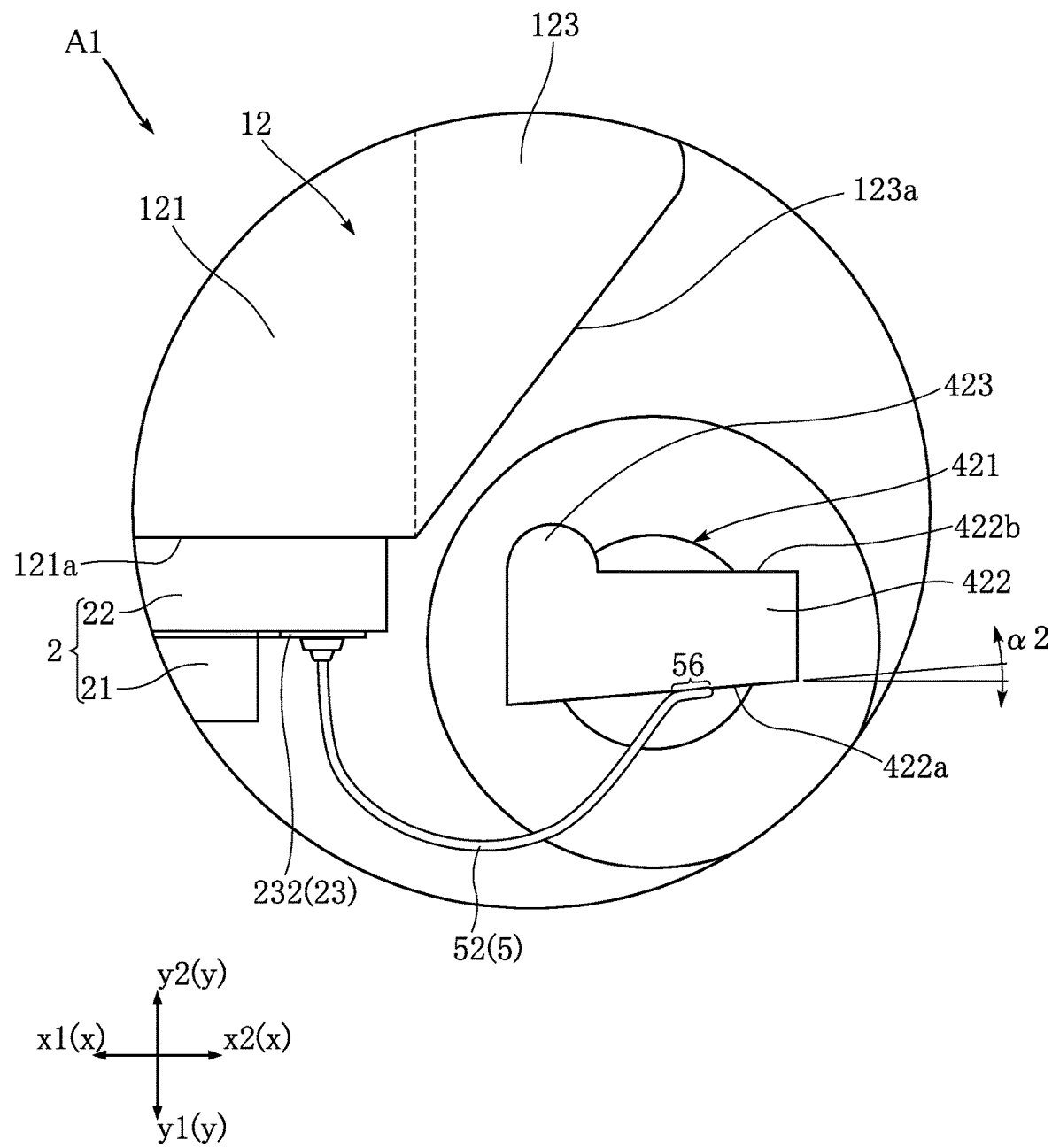
FIG. 6 is a plan view showing a part of the semiconductor laser device of FIG. 1.

FIG. 1 is a perspective view showing the semiconductor laser device A1. FIG. 2 is a plan view showing the semiconductor laser device A1. FIG. 3 is a cross-sectional view along line III-III of FIG. 2. FIG. 4 is a cross-sectional view along line IV-IV of FIG. 2. FIGS. 5 and 6 are plan views each showing a part of the semiconductor laser device A1.

The stem 1 is the foundation of the semiconductor laser device A1, and has a base 11 and a block 12. In the stem 1 of the present embodiment, the base 11 and the block 12 are integrally formed, but the present disclosure is not limited to this. The stem 1 is made of Fe or an Fe alloy, for example. The surface of the stem 1 may be subjected to Ni plating, Cu plating, or Au plating with a thickness of approximately 2 to 4 μm.

The base 11 is a plate-like member having a dimension (thickness) measured along the direction z, and has a circular shape as viewed in the thickness z, for example. The base 11 has an obverse surface 111 facing in the direction z1. For example, the base 11 has a diameter of approximately 5.6 mm, and a thickness of approximately 0.5 mm.

The base 11 is formed with through-holes 112 and 113. Each of the through-holes 112 and 113 passes through the base 11 in the direction z. In the illustrated example, the through-holes 112 and 113 are separated apart from each other in the direction x. Each of the through-holes 112 and 113 is a circular through-hole having a diameter of approximately 1.0 mm, but the present disclosure is not limited to this. The diameter of each of the through-holes 112 and 113 is selected appropriately according to the size of the base 11, the size of each of the leads 41 and 42, or the distance between the leads 41 and 42, for example.

The block 12 protrudes from the obverse surface 111 of the base 11 in the direction z1. In the present embodiment, the block 12 has a first block portion 121, a second block portion 122, and a third block portion 123. The first 121 block has portion a rectangular parallelepiped shape (see the broken line in FIG. 2). The first block portion 121 has a supporting surface 121a and a side surface 121b. The supporting surface 121a is a surface on which the semiconductor laser chip 2 is mounted. In the present embodiment, the supporting surface 121a is parallel to the direction z, and faces in the direction y1. The side surface 121b faces in the direction y2 opposite to the supporting surface 121a. The side surface 121b is parallel to the supporting surface 121a, and overlaps with the supporting surface 121a as viewed in the direction y (see FIG. 4).

In the manufacturing of the semiconductor laser device A1, dimensional errors may inevitably occur. Taking these errors into consideration, the direction in which the supporting surface 121a faces may be a direction substantially perpendicular to the direction z. Similarly, the side surface 121b may be substantially parallel to the supporting surface 121a. In the following description, the terms "perpendicular" and "parallel" include "substantially perpendicular" and "substantially parallel", respectively.

As shown in FIGS. 1 and 2, the second block portion 122 is shifted in the direction x1 relative to the first block portion 121, and is connected to the first block portion 121. The second block portion 122 has a fan shape as viewed in the direction z, and has a first wire bonding surface 122a. The first wire bonding surface 122a is a surface for connecting an end of one of the wires 5 (first wire 51).

As shown in FIG. 2, the first wire bonding surface 122a substantially faces in the direction y1, but is inclined relative to the supporting surface 121a. Specifically, the first wire bonding surface 122a is more inclined in the direction y2 with increasing distance from the supporting surface 121a in the direction x. As shown in FIG. 5, an angle α1 at which the first wire bonding surface 122a is inclined relative to the supporting surface 121a may be in the range of greater than 0° and no greater than 6° (0°<α1≤6°), and more preferably in the range of no less than 1° and no greater than 3° (1°≤α1≤3°).

As shown in FIG. 2, the third block portion 123 is shifted in the direction x2 relative to the first block portion 121, and is connected to the first block portion 121. The third block portion 123 has a fan shape as viewed in the direction z, and has a side surface 123a. The side surface 123a is inclined relative to the supporting surface 121a. Specifically, the side surface 123a is more inclined in the direction y2 with increasing distance from the supporting surface 121a in the direction x.

As shown in FIGS. 2 to 4, the base 11 is provided with a recess 114. The recess 114 is recessed from the obverse surface 111 in the direction z2. The recess 114 is shifted in the direction y1 relative to the supporting surface 121a of the block 12 as viewed in the direction z. The recess 114 is inclined to have a greater depth with increasing distance from the block 12 in the direction y1 (see FIG. 4).

The plurality of leads 41, 42, and 43 are used to fix the semiconductor laser device A1 to, for example, the circuit board of an electronic device, and form a power supply path to the semiconductor laser chip 2 as well as a conductive path to the light receiving element 3. The leads 41, 42, and 43 are rod-like members made of an Fe—Ni alloy, for example. The surface of each of the leads 41, 42, and 43 may be subjected to Au plating.

The lead 41 and the lead 42 are inserted through the through-hole 112 and the through-hole 113, respectively. As shown in FIGS. 1 to 3, the lead 41 has a first protruding portion 411 that protrudes from the base 11 in the direction z1. The lead 41 also has a protruding portion that protrudes from the base 11 in the direction z2, and this protruding portion is longer than the first protruding portion 411.

The first protruding portion 411 has an end surface 411a that faces in the direction z1. In the present embodiment, the end surface 411a is flat and parallel to the obverse surface 111 of the base 11. Alternatively, the end surface 411a may be inclined relative to the obverse surface 111 of the base 11. The inclination angle may be smaller than the aforementioned angle α1 (the inclination angle of the first wire bonding surface 122a relative to the supporting surface 121a).

The lead 42 has a second protruding portion 421 that protrudes from the base 11 in the direction z1. As shown in FIG. 3, the length of the second protruding portion 421 (protruding length from the base 11) is greater than the length of the first protruding portion 411.

The second protruding portion 421 has an end portion 422 that is spaced apart from the base 11 in the direction z1. In the present embodiment, the end portion 422 is different in shape and size from the other part of the second protruding portion 421. Specifically, as shown in FIG. 2, the other part of the second protruding portion 421 has a circular cross-sectional shape, whereas the end portion 422 has a substantially flat shape and has a thickness (minimum thickness or maximum thickness) smaller than the diameter of the other part of the second protruding portion 421. As shown in FIGS. 1 and 3, at least a part of the end portion 422 has a rectangular cross-sectional shape as viewed in the direction y, and has a width (size measured along the direction x) larger than the diameter of the other part of the second protruding portion 421. As shown in FIGS. 1 and 2, the end portion 422 has a second wire bonding surface 422a, a side surface 422b, and a protrusion 423. The second wire bonding surface 422a is a surface for connecting an end of one of the wires 5 (second wire 52).

The second wire bonding surface 422a substantially faces in the direction y1, but is slightly inclined relative to the supporting surface 121a of the block 12 (first block portion 121). Specifically, as shown in FIG. 6, the second wire bonding surface 422a is more inclined in the direction y2 with increasing distance from the supporting surface 121a in the direction x. In the present embodiment, an angle α2 at which the second wire bonding surface 422a is inclined to the supporting surface 121a may be in the range of greater than 0° and no greater than 6° (0°<α2≤6°), and more preferably in the range of no less than 1° and no greater than 3° (1°≤α2≤3°).

The side surface 422b faces in the direction opposite to the second wire bonding surface 422a. In the present embodiment, the side surface 422b faces in the direction y2. The side surface 422b has two end portions separated apart from each other in the direction x. The protrusion 423 is formed at one of the two end portions (the end portion in the direction x1) of the side surface 422b. The protrusion 423 protrudes in the direction y2.

The lead 41 has a length of approximately 7.6 to 7.8 mm, for example. Regarding the lead 41, the length of the portion accommodated in the through-hole 112 is approximately 1.0 mm, the length of the portion protruding in the direction z1 (i.e., the length of the first protruding portion 411) is approximately 0.1 to 0.3 mm, and the length of the portion protruding in the direction z2 is approximately 6.5 mm.

The lead 42 has a length of approximately 9.0 mm, for example. Regarding the lead 42, the length of the portion accommodated in the through-hole 113 is approximately 1.0 mm, the length of the portion protruding in the direction z1 (i.e., the length of the second protruding portion 421) is approximately 1.5 mm, and the length of the portion protruding in the direction z2 is approximately 6.5 mm.

As shown in FIG. 4, the lead 43 is bonded to the lower surface (the surface facing in the direction z2) of the base 11, and is electrically connected to the stem 1. As can be seen from FIGS. 3 and 4, in the present embodiment, the lead 43 overlaps with the block 12 of the stem 1 as viewed in the direction z. The lead 43 has a length of approximately 6.5 mm, for example.

In the present embodiment, each of the through-holes 112 and 113 is filled with an insulating filler 17. The insulating filler 17 has a function of fixing the leads 41 and 42 to the base 11 of the stem 1 and insulating the leads 41 and 42 from the stem 1. The insulating filler 17 may be made of, but not limited to, glass.

The semiconductor laser chip 2 is a light-emitting element in the semiconductor laser device A1. In the present embodiment, the semiconductor laser chip 2 includes a semiconductor laser element 21 and a sub-mount 22. In the present disclosure, the semiconductor laser chip 2 refers to a light-emitting element mounted on the stem 1, and may be configured without the sub-mount 22.

The semiconductor laser element 21 has a multi-layer structure in which a plurality of semiconductor layers are stacked on each other. As shown in FIG. 3, the semiconductor laser element 21 may have a shape elongated in the direction z. The semiconductor laser element 21 emits laser light L in the direction z1 (see FIG. 1). The sub-mount 22 is made of an insulating material such as AlN, and supports the semiconductor laser element 21. The sub-mount 22 is bonded to the supporting surface 121a of the block 12 via a bonding material. The bonding material may be, but not limited to, a metal paste or solder containing Ag, In, Au, or Sn.

In the present embodiment, the sub-mount 22 has a surface that faces in the direction y1, and a conductive portion 23 is formed on the surface. For example, the semiconductor laser element 21 is supported on the sub-mount 22 via the conductive portion 23. The conductive portion 23 can be formed from a paste material containing a conductive metal (e.g., Ag, In, Au, Sn, etc.). In the present embodiment, the conductive portion 23 includes a first conductive portion 231 and a second conductive portion 232. The first conductive portion 231 has a portion interposed between the sub-mount 22 and the semiconductor laser element 21, and a portion exposed from the semiconductor laser element 21. The first conductive portion 231 is electrically connected to a back electrode of the semiconductor laser element 21. The second conductive portion 232 is separated apart from the first conductive portion 231, and is entirely exposed from the semiconductor laser element 21.

As shown in FIGS. 1 to 4, the light receiving element 3 is housed in the recess 114 of the base 11. The light receiving element 3 is a photodiode, for example. Light (leakage light) is emitted from the semiconductor laser element 21 in the direction z2 as well, which is a direction opposite to the direction z1. The light receiving element 3 detects such leakage light. A back electrode is formed on the lower surface of the light receiving element 3, and is electrically bonded to the inner surface of the recess 114 via, for example, a metal paste. As a result, the light receiving element 3 is electrically connected to the lead 43 via the base 11.

As shown in FIGS. 1 and 2, the plurality of wires 5 includes a first wire 51, a second wire 52, a third wire 53, and a fourth wire 54. The first wire 51 connects the conductive portion 23 (first conductive portion 231) and the first wire bonding surface 122a of the block 12 (second block portion 122). The second wire 52 connects the conductive portion 23 (second conductive portion 232) and the second wire bonding surface 422a of the lead 42. The third wire 53 connects a pad electrode formed on a surface of the semiconductor laser element 21 and the conductive portion 23 (second conductive portion 232).

The lead 43 is electrically connected to the back electrode of the semiconductor laser element 21 via the base 11, the block 12, the first wire 51, and the conductive portion 23 (first conductive portion 231). The lead 42 is electrically connected to the pad electrode of the semiconductor laser element 21 via the second wire 52, the conductive portion 23 (second conductive portion 232), and the third wire 53. With such a configuration, in the semiconductor laser device A1, a power supply path to the semiconductor laser chip 2 (semiconductor laser element 21) is formed by the leads 42 and 43.

The fourth wire 54 connects a pad electrode formed on a surface of the light receiving element 3 and the end surface 411a of the lead 41. The lead 43 is electrically connected to the back electrode of the light receiving element 3 via the base 11. With such a configuration, in the semiconductor laser device A1, a conductive path to the light receiving element 3 is formed by the lead 41 and the lead 43.

Next, an example method for manufacturing the semiconductor laser device A1 will be described.

First, the stem 1 is formed. The stem 1 is formed by preparing an Fe material or an Fe alloy material, and cold-forging the material. As a result, the base 11 and the block 12 are integrally formed. Furthermore, the two through-holes 112 and 113 and the recess 114 are simultaneously formed in the base 11. In view of dimensional accuracy and manufacturing efficiency, it is preferable that the stem 1 be formed through cold forging. However, a method other than cold forging may also be used.

Next, the lead 43 is bonded to the lower surface of the base 11. For example, the lead 43 may be bonded by brazing. This allows for electrical connection between the lead 43 and the base 11. It is possible to employ a method other than brazing to electrically bond the lead 43 to the base 11. Next, the leads 41 and 42 are inserted into the through-holes 112 and 113, respectively. With the leads 41 and 42 inserted into the through-holes 112 and 113, the through-holes 112 and 113 are filled with a glass paste having a low melting point, and the glass paste is then fired. As a result, the glass paste is solidified to become the insulating filler 17. The leads 41 and 42 are fixed to the base 11 via the insulating filler 17 and electrically insulated from the base 11 by the insulating filler 17.

Figure 7:
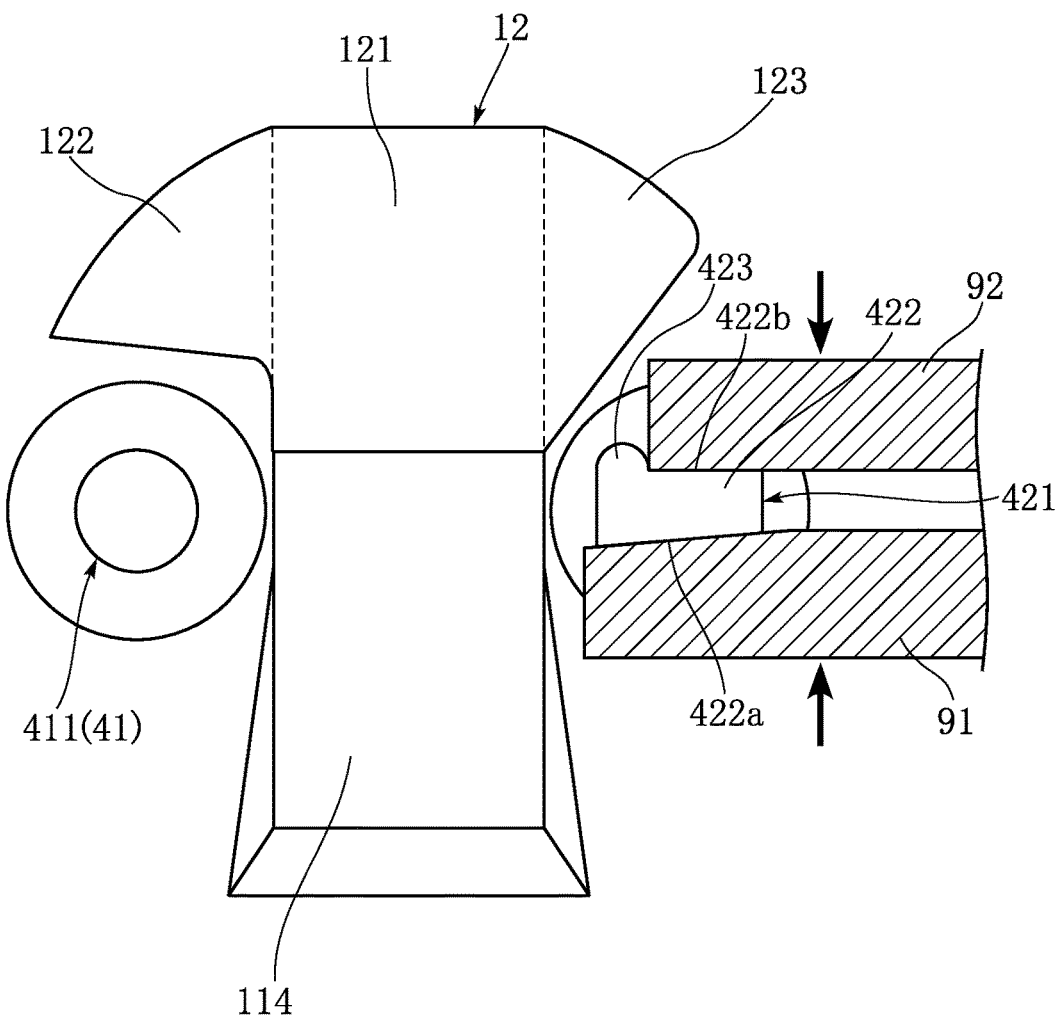
FIG. 7 is a plan view illustrating a step in an example method for manufacturing the semiconductor laser device of FIG. 1.

After the leads 41 and 42 are fixed to the stem 1, the end of the lead 42 in the direction z1 is pressed from both sides in the direction y. As a result, the end portion 422 having the second wire bonding surface 422a and the side surface 422b is formed. The pressing of the end may be performed with pressing members 91 and 92, as shown in FIG. 7. The end of the pressing member 91 in the direction x1 is inclined so as to correspond to the second wire bonding surface 422a. The pressing member 92 is shorter in length in the direction x than the pressing member 91 so as to avoid interference with the block 12 (third block portion 123). The pressing members 91 and 92 as described above are used to form the lead 42 with the end portion 422 having the protrusion 423.

Next, the semiconductor laser chip 2 (the sub-mount 22 and the semiconductor laser element 21) and the light receiving element 3 are mounted on the stem 1, and the wires 5 are connected to the semiconductor laser chip 2 and the light receiving element 3 at appropriate positions by wire bonding.

The wire 5 (third wire 53) is connected to the pad electrode of the semiconductor laser element 21 and the conductive portion 23 (second conductive portion 232) by performing first bonding on the pad electrode of the semiconductor laser element 21 and performing second bonding, on the conductive portion 23 (second conductive portion 232), that uses ultrasonic waves oscillated from a capillary. During the first bonding and the second bonding, the capillary is pressed in the direction y2, which is perpendicular to the supporting surface 121a.

The wire 5 (first wire 51) is connected to the conductive portion 23 (first conductive portion 231) and the first wire bonding surface 122a of the block 12 by performing first bonding on the conductive portion 23 (first conductive portion 231) and performing second bonding on the first wire bonding surface 122a. During the first bonding and the second bonding, the capillary is pressed in the direction y2, which is perpendicular to the supporting surface 121a.

The wire 5 (second wire 52) is connected to the conductive portion 23 (second conductive portion 232) and the second wire bonding surface 422a of the lead 42 by performing first bonding on the conductive portion 23 (second conductive portion 232) and performing second bonding on the second wire bonding surface 422a. During the first bonding and the second bonding, the capillary is pressed in the direction y2, which is perpendicular to the supporting surface 121a. The wire bonding operation on the semiconductor laser element 21, the conductive portion 23 (first conductive portion 231 and second conductive portion 232), the first wire bonding surface 122a, and the second wire bonding surface 422a is performed by a wire bonding device, for example, while holding the periphery of the base 11.

The wire 5 (fourth wire 54) is connected to the pad electrode of the light receiving element 3 and the end surface 411a of the lead 41 by performing first bonding on the pad electrode of the light receiving element 3 and performing second bonding on the end surface 411a. During the first bonding and the second bonding, the capillary is pressed in the direction z2. The semiconductor laser device A1 is manufactured by performing the series of operations as described above.

The following describes the advantages of the semiconductor laser device A1.

In the present embodiment, the first wire bonding surface 122a, which is for connecting the wire 5 (first wire 51) between the first wire bonding surface 122a and the semiconductor laser chip 2 (first conductive portion 231 on the sub-mount 22) supported by the supporting surface 121a, is inclined relative to the supporting surface 121a. Specifically, the first wire bonding surface 122a is shifted in the direction x with respect to the supporting surface 121a, and is more inclined in the direction y2 with increasing distance from the supporting surface 121a in the direction x (see FIG. 5).

As described above, the wire connecting operation between the semiconductor laser chip 2 and the first wire bonding surface 122a is performed by the wire bonding device while holding the periphery of the base 11. Since the periphery of the base 11 is circular, the base 11 may be more or less displaced in the peripheral direction from the desired position. If the first wire bonding surface 122a is more inclined in the direction y1 (the direction opposite to the inclination direction shown in FIG. 5) with increasing distance from the supporting surface 121a in the direction x, the bonding surface formed by the second bonding may become small. According to the present embodiment, it is possible to prevent the first wire bonding surface 122a from being inclined in the direction opposite to the inclination direction shown in FIG. 5 due to the displacement of the base 11 during the wire bonding operation. This ensures that a bonding portion (stitch bonding portion 55 shown in FIG. 5), which is bonded to the first wire bonding surface 122a and formed by the second bonding to the first wire bonding surface 122a, has an appropriate size. As a result, a decrease in the bonding strength of the wire 5 (first wire 51) due to, for example, the displacement of the base 11 during the wire bonding operation, can be prevented.

When the angle α1 at which the first wire bonding surface 122a is inclined relative to the supporting surface 121a is in the range of greater than 0° and no greater than 6° as described above, the wire bonding operation (second bonding) can be appropriately performed. As a result, the wire 5 (first wire 51) that connects the semiconductor laser chip 2 and the first wire bonding surface 122a is appropriately formed.

The lead 41 has the first protruding portion 411 that protrudes from the base 11 in the direction z1. The first protruding portion 411 overlaps with the first wire bonding surface 122a as viewed in the direction y, and slightly protrudes from the base 11 in the direction z1. The length of the first protruding portion 411 protruding from the base 11 is smaller than the length of the second protruding portion 421 of the lead 42. With such a configuration, it is possible to appropriately connect the wire 5 (first wire 51) to the semiconductor laser chip 2 and the first wire bonding surface 122*a* while avoiding the interference with the first protruding portion 411.

The block 12 (first block portion 121) is formed with the side surface 121*b* facing in the direction opposite to the supporting surface 121*a* and overlapping with the supporting surface 121*a* as viewed in the direction y. The side surface 121*b* is parallel to the supporting surface 121*a*. According to the configuration, during the manufacturing process of the semiconductor laser device A1, the stem 1 can be easily held by utilizing the supporting surface 121*a* and the side surface 121*b* that are parallel to each other.

In the present embodiment, the second wire bonding surface 422*a*, which is for connecting the wire 5 (second wire 52) between the second wire bonding surface 422*a* and the semiconductor laser chip 2 (second conductive portion 232 on the sub-mount 22) supported by the supporting surface 121*a*, is inclined relative to the supporting surface 121*a*. Specifically, the second wire bonding surface 422*a* is shifted in the direction x with respect to the supporting surface 121*a*, and is more inclined in the direction y 2 with increasing distance from the supporting surface 121*a* in the direction x (see FIG. 6).

According to the configuration in which the second wire bonding surface 422*a* is inclined relative to the supporting surface 121*a* as described above, a bonding portion (stitch bonding portion 56 shown in FIG. 6), which is bonded to the second wire bonding surface 422*a* and formed by the second bonding to the second wire bonding surface 422*a*, can reliably have an appropriate size. As a result, a decrease in the bonding strength of the wire 5 (second wire 52) caused by the displacement of the base 11 during the wire bonding operation can be prevented.

When the angle α2 at which the second wire bonding surface 422*a* is inclined relative to the supporting surface 121*a* is in the range of greater than 0° and no greater than 6° as described above, the wire bonding operation (second bonding) can be appropriately performed. As a result, the wire 5 (second wire 52) that connects the semiconductor laser chip 2 and the second wire bonding surface 422*a* is appropriately formed.

Figure 8:
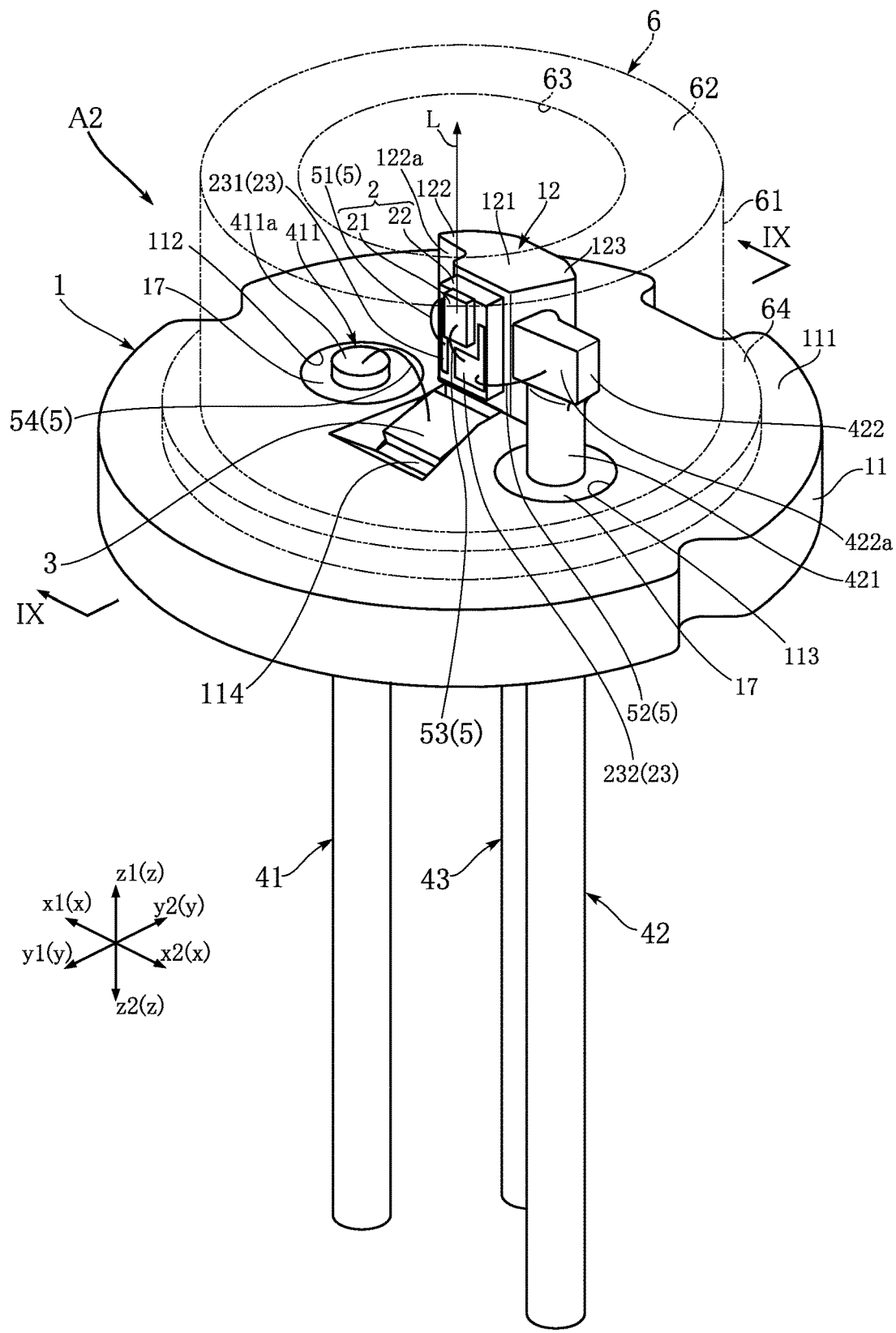
FIG. 8 is a perspective view showing a semiconductor laser device according to a second embodiment.
Figure 9:
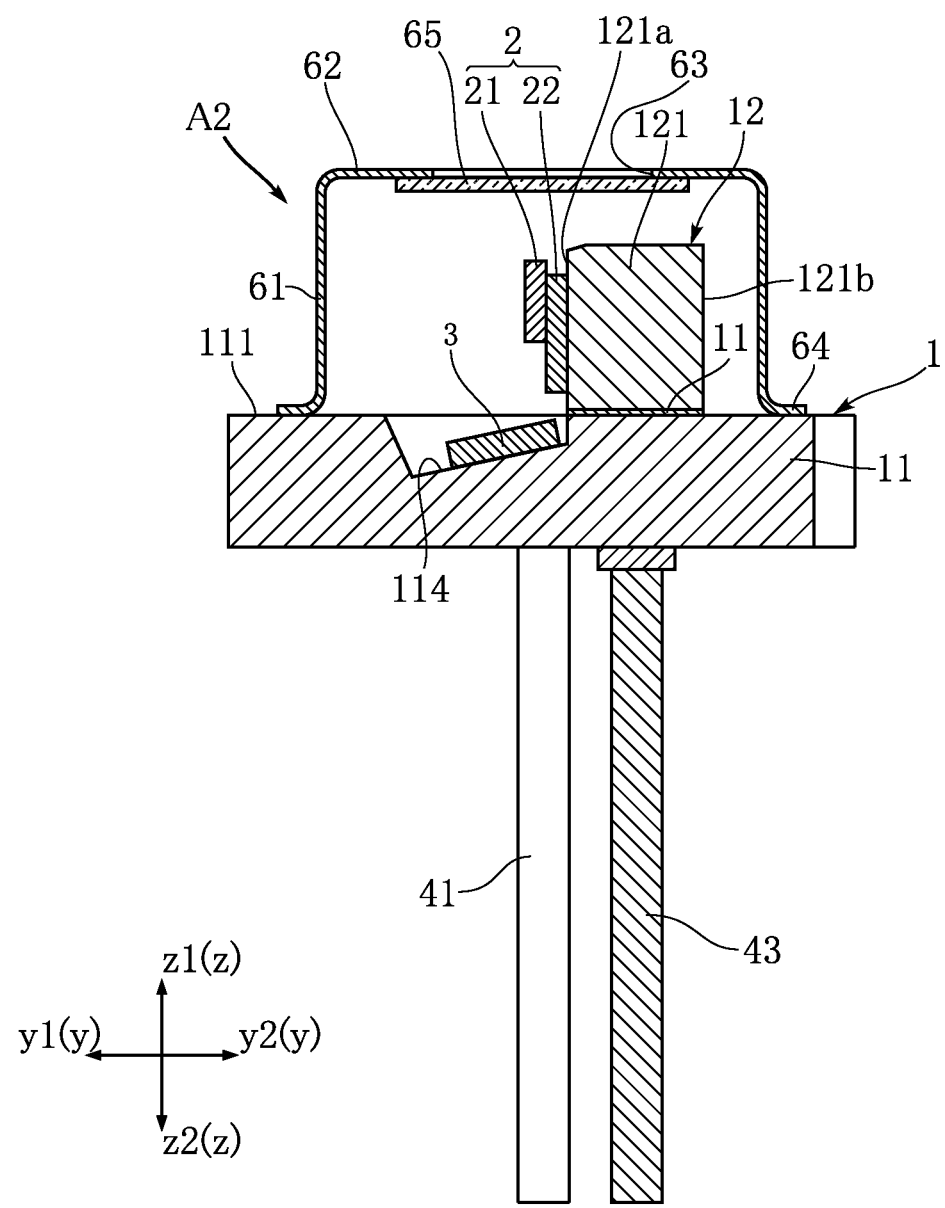
FIG. 9 is a cross-sectional view along line IX-IX of FIG. 8.

FIGS. 8 and 9 show a semiconductor laser device according to a second embodiment. Note that in FIGS. 8 and 9, elements that are the same as or similar to the elements in the first embodiment are provided with the same reference signs, and descriptions of such elements are omitted as appropriate.

A semiconductor laser device A2 is different from the semiconductor laser device according to the first embodiment in the configuration of the stem 1 and in including a cap 6.

In the semiconductor laser device A2, the base 11 and the block 12 are separately formed. As shown in FIG. 9, the base 11 and the block 12 are bonded to each other by a bonding member 18. For example, the base 11 is made of Fe or an Fe alloy as described above. The block 12 may be made of Fe or an Fe alloy. Alternatively, the block 12 may be made of Cu or a Cu alloy. The bonding member 18 may be made of a paste containing metal, a bonding alloy used for brazing, or a welding portion formed as a result of welding.

The cap 6 covers the semiconductor laser chip 2 and the block 12, and is fixed to the obverse surface 111 of the base 11 of the stem 1. The cap 6 has a body portion 61, a top portion 62, a flange portion 64, and a transparent cover 65. The body portion 61 surrounds the semiconductor laser chip 2 and the block 12 as viewed in the z direction, and has a circular shape, for example. In FIG. 8, the cap 6 is shown by an imaginary line.

The top portion 62 is connected to the end of the body portion 61 in the direction z1 and is offset further in the direction z1 than the semiconductor laser chip 2. In the present embodiment, the top portion 62 has a circular shape. The top portion 62 is formed with an opening 63. The opening 63 allows passage of light from the semiconductor laser chip 2. In the present embodiment, the opening 63 has a circular shape.

The flange portion 64 is connected to the end of the body portion 61 in the direction z2, and extends outward along the xy plane. The flange portion 64 has an annular shape, for example, and is fixed to the obverse surface 111 of the base 11 by welding or a bonding member, for example.

The transparent cover 65 closes the opening 63 and transmits light from the semiconductor laser chip 2. The transparent cover 65 is made of a material that is transparent to light from the semiconductor laser chip 2. The use of the cap 6 (and the transparent cover 65) allows light from the semiconductor laser device A2 to be selectively emitted via a relatively narrow area. In the present embodiment, the transparent cover 65 is attached to the lower surface of the top portion 62 of the cap 6.

Again, in the present embodiment, the first wire bonding surface 122*a* is shifted in the direction x with respect to the supporting surface 121*a*, and is more inclined in the direction y2 with increasing distance from the supporting surface 121*a* in the direction x. Such a configuration can prevent a decrease in the bonding strength of the wire 5 (first wire 51) caused by the displacement of the base 11 during the wire bonding operation for forming the wire 5 (first wire 51). Furthermore, the semiconductor laser device A2 of the present embodiment has the same advantages as those described above with respect to the semiconductor laser device A1.

In the second embodiment, the base 11 and the block 12 are separately formed. The block 12 may be made of Cu, which has a higher thermal conductivity than Fe, so as to increase the heat dissipation property of the block 12 (stem 1).

In the second embodiment, the cap 6 can more reliably protect the semiconductor laser chip 2. The transparent cover 65 is provided so that the light emitted from the semiconductor laser device A2 has a relatively high directivity.

Although various embodiments have been described above, the present disclosure is not limited to these embodiments and various changes can be made without departing from the spirit of the present invention. Various changes can be made to the specific configuration of the semiconductor laser device according to the present disclosure.

The present disclosure includes the configurations defined in the following clauses.

Clause 1.

A semiconductor laser device comprising:
a semiconductor laser chip that emits laser light in an emitting direction;
a base having a plate-like shape; and
a block protruding from the base in the emitting direction and supporting the semiconductor laser chip,
wherein the block has a supporting surface and a first wire bonding surface, the supporting surface facing a first side in a first direction perpendicular to the emitting direction and supporting the semiconductor laser chip, the first wire bonding surface being a surface to which a first electrically connected to the semiconductor laser chip is connected, the first wire bonding surface is shifted in a second direction, is perpendicular to the emitting which direction and the first direction, with respect to the supporting surface, and the first wire bonding surface is inclined relative to the supporting surface, such that the first wire bonding surface is more offset to a second side in the first direction with increasing distance from the supporting surface in the second direction.

Clause 2.

The semiconductor laser device according to clause 1, wherein an inclination angle of the first wire bonding surface relative to the supporting surface is in a range of greater than 0° and no greater than 6°.

Clause 3.

The semiconductor laser device according to clause 1 or 2, further comprising a first lead and a second lead that are supported by the base, wherein the first lead and the second lead flank the supporting surface, and are separated apart from each other in the second direction.

Clause 4.

The semiconductor laser device according to clause 3, wherein the first lead has a first protruding portion that protrudes from the base in the emitting direction, and the second lead has a second protruding portion that protrudes from the base in the emitting direction, and the second protruding portion has a protruding length greater than that of the first protruding portion.

Clause 5.

The semiconductor laser device according to clause 4, wherein the base has an obverse surface facing in the emitting direction, and the first protruding portion has an end surface facing in the emitting direction, and the inclination angle of the first wire bonding surface relative to the supporting surface is larger than an inclination angle of the end surface of the first protruding portion relative to the obverse surface of the base.

Clause 6.

The semiconductor laser device according to clause 5, wherein the obverse surface of the base and the end surface of the protruding portion are parallel to each other.

Clause 7.

The semiconductor laser device according to any of clauses 4 to 6, wherein the first protruding portion overlaps with the first wire bonding surface as viewed in the first direction, and the first wire bonding surface is more offset to the second side in the first direction than the supporting surface.

Clause 8.

The semiconductor laser device according to any of clauses 4 to 7, wherein the second protruding portion has an end portion separated apart from the base in the emitting direction and formed with a second wire bonding surface for connecting a second wire electrically connected to the semiconductor laser chip, and the second wire bonding surface is inclined relative to the supporting surface, such that the second wire bonding surface is more offset to the second side in the first direction with increasing distance from the supporting surface in the second direction.

Clause 9.

The semiconductor laser device according to clause 8, wherein an inclination angle of the second wire bonding surface relative to the supporting surface is in a range of greater than 0° and no greater than 6°.

Clause 10.

The semiconductor laser device according to clause 9, wherein the block has a first block portion, a second block portion, and a third block portion that are all integrally formed, the first block portion including the supporting surface, the second block portion including the first wire bonding surface, the third block portion overlapping with the second protruding portion as viewed in the first direction.

Clause 11.

The semiconductor laser device according to clause 10, wherein the first block portion has a side surface positioned opposite and parallel to the supporting surface.

Clause 12.

The semiconductor laser device according to clause 10 or 11, wherein the second protruding portion has a side surface opposite to the second wire bonding surface, the side surface having a first end portion and a second end portion separated apart from each other in the second direction, the first end portion being formed with a protrusion that protrudes in the second side in the first direction.

Clause 13.

The semiconductor laser device according to any of clauses 8 to 12, wherein the semiconductor laser chip includes a semiconductor laser element, and a sub-mount on which the semiconductor laser element is mounted and that is made of an insulating material.

Clause 14.

The semiconductor laser device according to clause 13, wherein the sub-mount is formed with a conductive portion, and the semiconductor laser element is supported by the sub-mount via the conductive portion, and the first wire is connected to the conductive portion and the first wire bonding surface, and the second wire is connected to the conductive portion and the second wire bonding surface.

Clause 15.

The semiconductor laser device according to any of clauses 1 to 14, wherein the base and the block are integrally formed.

The invention claimed is:

1. A semiconductor laser device comprising:
a semiconductor laser chip that emits laser light in an emitting direction;
a base having a plate-like shape; and
a block protruding from the base in the emitting direction and supporting the semiconductor laser chip,
wherein the block has a supporting surface and a first wire bonding surface, the supporting surface facing a first side in a first direction perpendicular to the emitting direction and supporting the semiconductor laser chip, the first wire bonding surface being a surface to which a first wire electrically connected to the semiconductor laser chip is connected,
the first wire bonding surface is shifted in a second direction, which is perpendicular to the emitting direction and the first direction, with respect to the supporting surface, and
the first wire bonding surface is inclined relative to the supporting surface, such that the first wire bonding surface is more offset from the supporting surface to a second side in the first direction with increasing distance from the supporting surface in the second direction,
the semiconductor laser device further comprises a first lead and a second lead that are supported by the base, the first lead and the second lead flank the supporting surface, and are separated apart from each other in the second direction, the first lead has a first protruding portion that protrudes from the base in the emitting direction, and the second lead has a second protruding portion that protrudes from the base in the emitting direction, the second protruding portion has a protruding length greater than that of the first protruding portion, the second protruding portion has an end portion separated apart from the base in the emitting direction and formed with a second wire bonding surface for connecting a second wire electrically connected to the semiconductor laser chip, and the second wire bonding surface is inclined relative to the supporting surface, such that the second wire bonding surface is more offset to the second side in the first direction with increasing distance from the supporting surface in the second direction.

2. The semiconductor laser device according to claim 1, wherein an inclination angle of the first wire bonding surface relative to the supporting surface is in a range of greater than 0° and no greater than 6°.

3. The semiconductor laser device according to claim 1, wherein the base has an obverse surface facing in the emitting direction, and the first protruding portion has an end surface facing in the emitting direction, and the inclination angle of the first wire bonding surface relative to the supporting surface is larger than an inclination angle of the end surface of the first protruding portion relative to the obverse surface of the base.

4. The semiconductor laser device according to claim 3, wherein the obverse surface of the base and the end surface of the first protruding portion are parallel to each other.

5. The semiconductor laser device according to claim 1, wherein the first protruding portion overlaps with the first wire bonding surface as viewed in the first direction, and the first wire bonding surface is more offset to the second side in the first direction than the supporting surface.

6. The semiconductor laser device according to claim 1, wherein an inclination angle of the second wire bonding surface relative to the supporting surface is in a range of greater than 0° and no greater than 6°.

7. The semiconductor laser device according to claim 6, wherein the block has a first block portion, a second block portion, and a third block portion that are all integrally formed, the first block portion including the supporting surface, the second block portion including the first wire bonding surface, the third block portion overlapping with the second protruding portion as viewed in the first direction.

8. The semiconductor laser device according to claim 7, wherein the first block portion has a side surface positioned opposite and parallel to the supporting surface.

9. The semiconductor laser device according to claim 7, wherein the second protruding portion has a side surface opposite to the second wire bonding surface, the side surface having a first end portion and a second end portion separated apart from each other in the second direction, the first end portion being formed with a protrusion that protrudes in the second side in the first direction.

10. The semiconductor laser device according to claim 1, wherein the semiconductor laser chip includes a semiconductor laser element, and a sub-mount on which the semiconductor laser element is mounted and that is made of an insulating material.

11. The semiconductor laser device according to claim 10, wherein the sub-mount is formed with a conductive portion, and the semiconductor laser element is supported by the sub-mount via the conductive portion, and the first wire is connected to the conductive portion and the first wire bonding surface, and the second wire is connected to the conductive portion and the second wire bonding surface.

12. The semiconductor laser device according to claim 1, wherein the base and the block are integrally formed.

* * * * *